US007495371B2

(12) United States Patent
Goodson

(10) Patent No.: US 7,495,371 B2
(45) Date of Patent: Feb. 24, 2009

(54) CLEANING TANK WITH SLEEVED ULTRASONIC TRANSDUCER

(75) Inventor: J. Michael Goodson, Skillman, NJ (US)

(73) Assignee: The Crest Group, Inc., Trenton, NJ (US)

( * ) Notice: Subject to any disclaimer, the term of this patent is extended or adjusted under 35 U.S.C. 154(b) by 650 days.

(21) Appl. No.: 10/936,104

(22) Filed: Sep. 8, 2004

(65) Prior Publication Data

US 2005/0109368 A1 May 26, 2005

Related U.S. Application Data

(60) Provisional application No. 60/501,236, filed on Sep. 8, 2003.

(51) Int. Cl.
*H01L 41/08* (2006.01)

(52) U.S. Cl. ....................................... 310/325; 310/337

(58) Field of Classification Search ............ 310/323.01, 310/325, 337
See application file for complete search history.

(56) References Cited

U.S. PATENT DOCUMENTS

| | | | | |
|---|---|---|---|---|
| 3,575,383 | A | 4/1971 | Coleman | 259/72 |
| 4,527,901 | A | 7/1985 | Cook | 366/127 |
| 5,247,954 | A | 9/1993 | Grant et al. | 134/184 |
| 5,748,566 | A | 5/1998 | Goodson | 367/158 |
| 5,998,908 | A | 12/1999 | Goodson | 310/325 |
| 6,433,460 | B1 | 8/2002 | Puskas | 310/317 |
| 6,722,379 | B2 * | 4/2004 | Beck et al. | 134/184 |
| 6,924,585 | B2 * | 8/2005 | Goodson | 310/325 |
| 2004/0251780 | A1 | 12/2004 | Goodson | 310/323.18 |

FOREIGN PATENT DOCUMENTS

| | | |
|---|---|---|
| GB | 2 150 252 A | 6/1985 |

* cited by examiner

*Primary Examiner*—Mark Budd
(74) *Attorney, Agent, or Firm*—K & L Gates LLP

(57) ABSTRACT

A ultrasonic cleaning system includes a tank composed of quartz or silicon carbide and one or more sleeved ultrasonic transducers mounted to the tank. The sleeved ultrasonic transducer has a two-part head mass, including a threaded sleeve and an outer housing that are composed of different materials. The threaded sleeve is preferably a metal that provides superior thread strength for mating with a compression bolt, while the outer housing is preferably silicon carbide or other ceramic material that provides a good thermal expansion match to the tank to facilitate adhesive bonding of the transducer to the tank.

25 Claims, 3 Drawing Sheets

CLEANING TANK WITH SLEEVED ULTRASONIC TRANSDUCER

RELATED APPLICATION

This application claims priority from U.S. Provisional Application No. 60/501,236, filed Sep. 8, 2003, entitled QUARTZ TANK WITH BONDED ULTRASONIC TRANSDUCER, invented by J. Michael Goodson. This provisional application is expressly incorporated herein by reference.

BACKGROUND OF THE INVENTION

1. Field of the Invention

This invention relates generally to ultrasonic generators, transducers, and converters used for ultrasonic cleaning applications, and relates more particularly to an ultrasonic transducer or converter having a two-piece head mass adhesively bonded to a quartz or ceramic cleaning tank.

2. Description of the Relevant Art

Ultrasonic power at a predetermined frequency or range of frequencies is used to provide energy in a container or tank to ultrasonically clean, rinse, or otherwise process parts in an aqueous solution. Early ultrasonic cleaning systems consisted of transducers and tanks made primarily from stainless steel. U.S. Pat. Nos. 5,748,566 and 5,998,908 (incorporated herein by reference) relate to my development of a transducer made in part from Advanced Ceramic materials. It was recognized that a ceramic resonator within the transducer could provide significant improvements in performance. It was also recognized that tanks made from inert materials such as quartz and silicon carbide have advantages over stainless steel tanks, as disclosed in my co-pending application Ser. No. 10/840,919, filed May 7, 2004 (incorporated herein by reference).

Prior attempts have been made to bond or otherwise attach ultrasonic transducers to a quartz or silicon carbide cleaning tank, but were unsuccessful due to bond failures. If the material of the tank and that of the head mass of the ultrasonic transducer are different, there may be a mismatch in the coefficients of thermal expansion, which can cause failure of the adhesive bond. The tank may be made of quartz and the head mass of the transducer may be made of aluminum, which have significantly different coefficients of thermal expansion.

SUMMARY OF THE INVENTION

In summary, the present invention is an ultrasonic cleaning system having a tank composed of quartz or silicon carbide, and one or more ultrasonic transducers mounted to the tank, wherein each transducer includes a head mass composed at least in part of silicon carbide or other ceramic that is adhesively bonded to the tank. The head mass has a threaded sleeve and an outer housing of a different material. Since the head mass is composed of two parts, they can be made of different materials, each selected to optimize a different property or function. The threaded sleeve is preferably metal that provides adequate thread strength for mating with an axial compression bolt; while the outer housing is preferably ceramic that provides a good thermal expansion match to the tank.

More specifically, the ultrasonic transducer of the present invention includes one or more disk-shaped piezoelectric crystals, wherein each piezoelectric crystal has an axial hole; a tail mass positioned on one side of the piezoelectric crystals, wherein the tail mass includes an axial hole; a head mass positioned on a side of the piezoelectric crystals opposite the tail mass, wherein the head mass has an internally-threaded axial hole; and a threaded bolt positioned within the axial hole of each piezoelectric crystal and the axial holes of the tail mass and head mass and threaded into the internally-threaded axial hole of the head mass, wherein the bolt compresses the piezoelectric crystals between the tail mass and head mass. The head mass includes two pieces composed of different materials, including a threaded sleeve that has the internally-threaded axial hole and has a reduced diameter section and further including an outer housing that is axially outside the reduced diameter section of the threaded sleeve.

Preferably, the threaded sleeve and the outer housing have mating contact surfaces on a plane perpendicular to an axis of the transducer. Also preferably, an outer diameter of the reduced diameter section of the threaded sleeve is substantially equal to an inner diameter of the one or more piezoelectric crystals.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter. For example, the specification uses the terms transducer, converter, and generator interchangeably to refer to a device that generates ultrasonic vibrations in response to an electrical driving signal. The term piezoelectric crystal is used interchangeably with the terms piezoelectric transducer and PZT. Also, the terms head mass and front driver are used interchangeably to refer to the portion of the transducer (or converter or generator) through which the ultrasonic vibrational energy passes to the object of interest. Likewise, the terms tail mass and back driver are used interchangeably to refer to the portion of the transducer (or converter or generator) that is opposite the head mass (or front driver) and that provides a mass to balance the vibrations of the piezoelectric crystals.

DETAILED DESCRIPTION OF THE PREFERRED EMBODIMENTS

The drawings depict various preferred embodiments of the present invention for purposes of illustration only. One skilled in the art will readily recognize from the following discussion that alternative embodiments of the structures and methods illustrated herein may be employed without departing from the principles of the invention described herein.

The present invention relates to an improvement in ultrasonic transducers used in cleaning systems. More specifically, it has now been recognized that enhanced performance can be achieved by forming the tank or vessel out of quartz or an Advanced Ceramic material and by bonding the transducer directly to a surface of the tank.

Ultrasonic transducers commonly used for cleaning operations have a stacked construction. A typical transducer has one or more piezoelectric crystals shaped in the form of a disk with an annular hole. The piezoelectric crystal is oriented so that expansion and contraction in response to applied electrical signals is axial in direction. In other words, the piezoelectric crystal operates in thickness mode, which means it expands and contracts primarily in the direction of the axis of the transducer.

On one side of the piezoelectric crystal is a tail mass and on the other side is a head mass. A screw or bolt compresses the piezoelectric crystal between the head mass and tail mass. The head mass is mounted on the tank and transmits vibrations from the piezoelectric crystal to the tank. The tail mass balances the displacements caused by the expansion and contraction of the piezoelectric crystal. In my prior U.S. Pat. Nos. 5,748,566 and 5,998,908, I disclosed an improvement to a stacked transducer construction, which added a resonator made of a ceramic material between the piezoelectric crystal and the head mass.

One problem to overcome in bonding a transducer to a cleaning tank is inconsistent material properties between the materials used for the tank and transducer. Head and tail masses are commonly made from metals, such as aluminum, which have a much higher coefficient of thermal expansion than quartz or ceramics such as silicon carbide.

Figure 4:
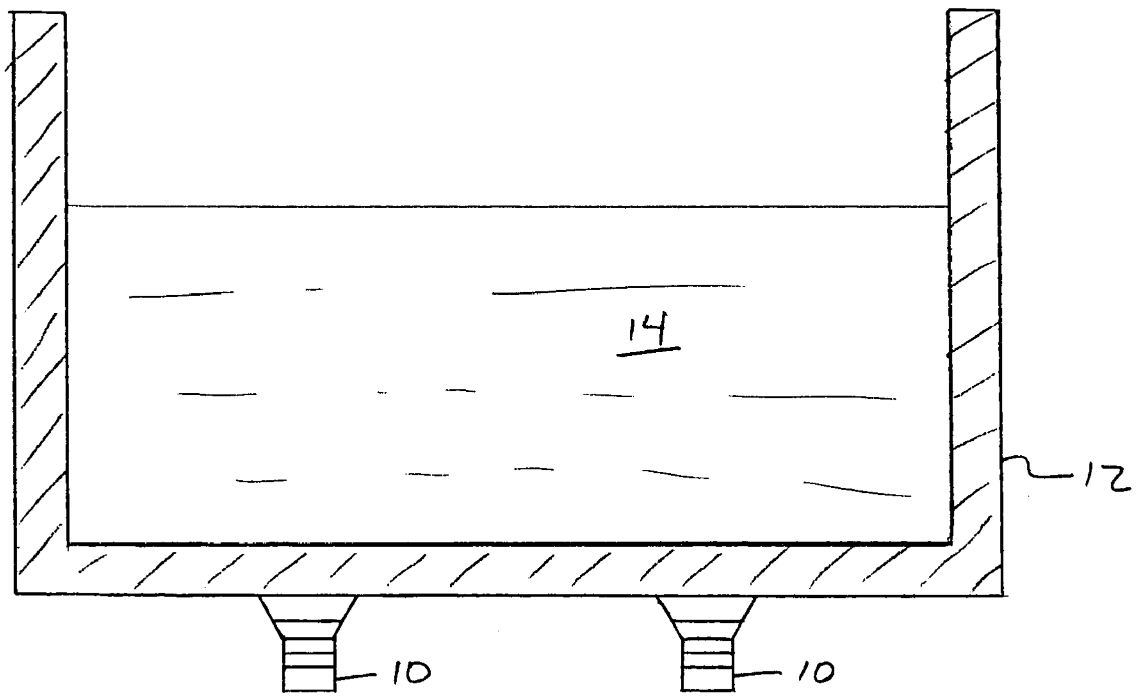
FIG. 4 is a side sectional view of a cleaning tank with two sleeved ultrasonic transducers attached, according to the present invention.

The present invention has a different construction for the transducer, which facilitates bonding of the transducer to a tank. Typically more than one transducer is mounted to a tank, either internally or externally. Commonly several transducers 10 are mounted to the bottom of a cleaning tank 12, as shown in FIG. 4. The tank contains a liquid or aqueous solution 14 and parts (not shown) to be cleaned, rinsed, or otherwise processed using ultrasonics. The transducers 10 are excited by an alternating current. Vibrations caused by the piezoelectric crystals of the transducers are transferred into the tank and through the liquid to the parts in the tank.

Figure 2:
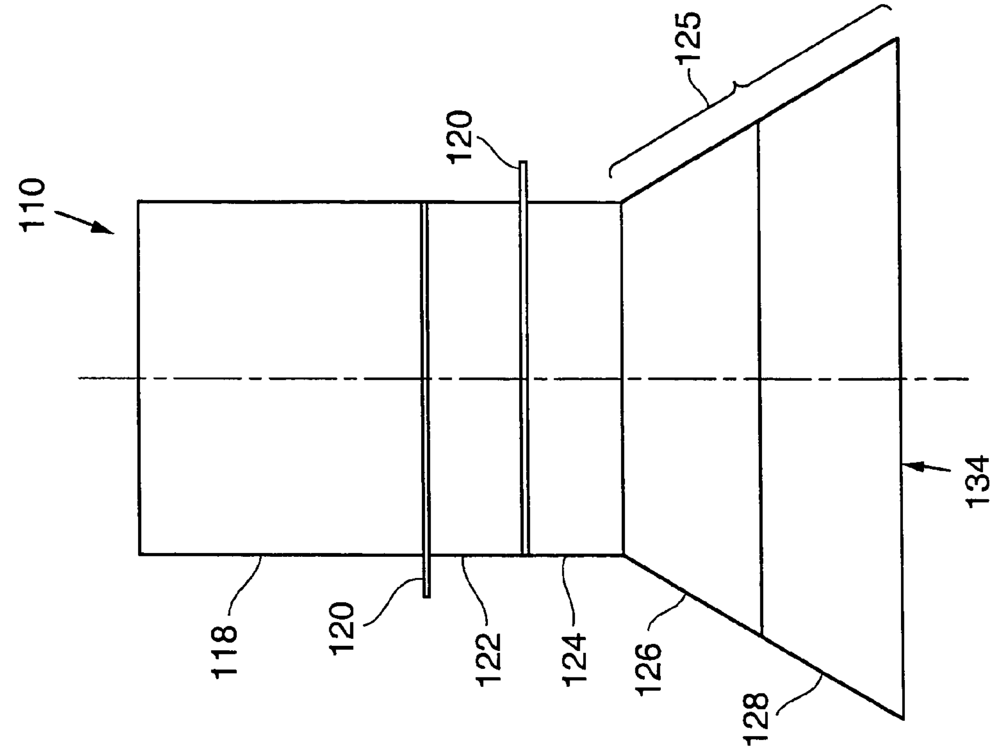
FIG. 2 is a side view the transducer of FIG. 1.
Figure 1:
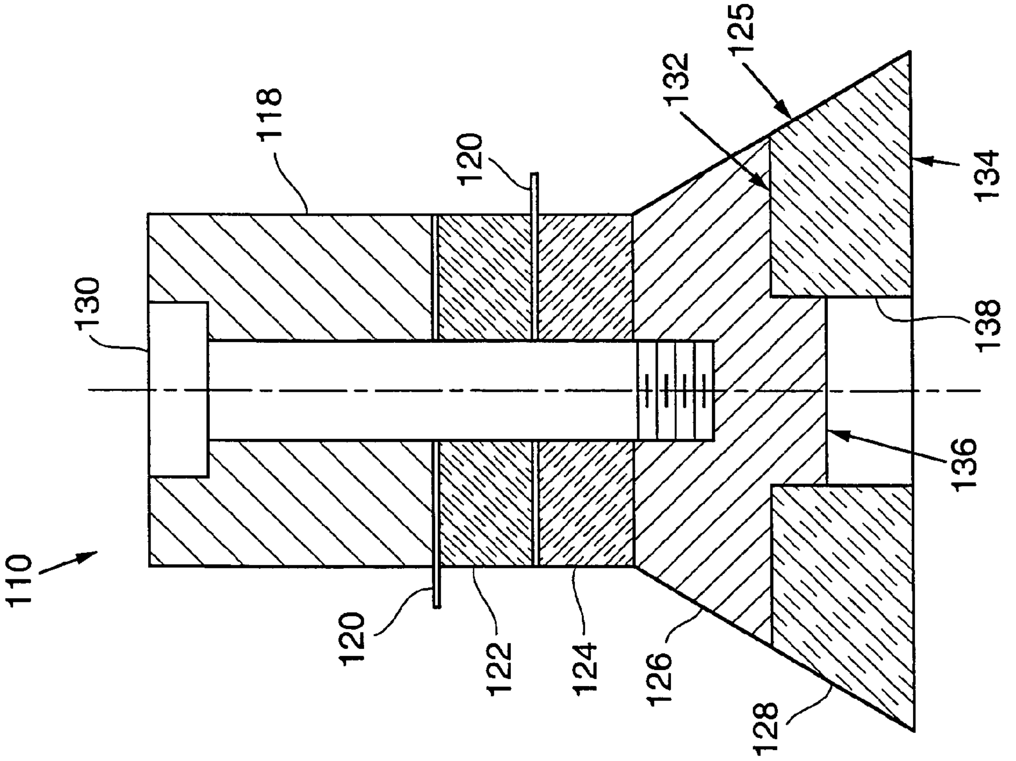
FIG. 1 is a side sectional view of a first embodiment of a sleeved ultrasonic transducer according to the present invention.

The construction of another embodiment of the transducer of the present invention is shown as transducer 110 in FIGS. 1 and 2. The components of the transducer 110, from the top, include a tail mass 118, electrode 120, piezoelectric crystal 122, electrode 120, ceramic resonator 124, and a head mass 125 that includes a threaded sleeve 126 and an outer housing 128. A bolt 130 is threaded into an internally threaded hole in the threaded sleeve 122 and compresses the electrodes 120, piezoelectric crystal 122 and ceramic resonator 124 between the tail mass 118 and the head mass 125. The outer housing 128 is preferably composed of silicon carbide or other ceramic material and is bonded to a flat surface 132 and an axial hole 138 of the threaded sleeve 126. Preferably, the outer housing is composed of a metal or non-metallic material that has a coefficient of thermal expansion that is similar to the coefficient of thermal expansion of the material of the tank. Another flat surface 134 of the outer housing 128 is bonded to a surface of a cleaning tank. A protrusion 136 at the bottom of the threaded sleeve 126 mates with the axial hole 138 of the outer housing 128 to assist in positioning the threaded sleeve relative to the outer housing. All the parts of the transducer except the electrodes 120 are axially symmetrical. The tail mass 118 and threaded sleeve 126 are preferably composed of aluminum material, but may be made of other non-metallic materials or metals such as titanium if thread strength is an issue.

Figure 3:
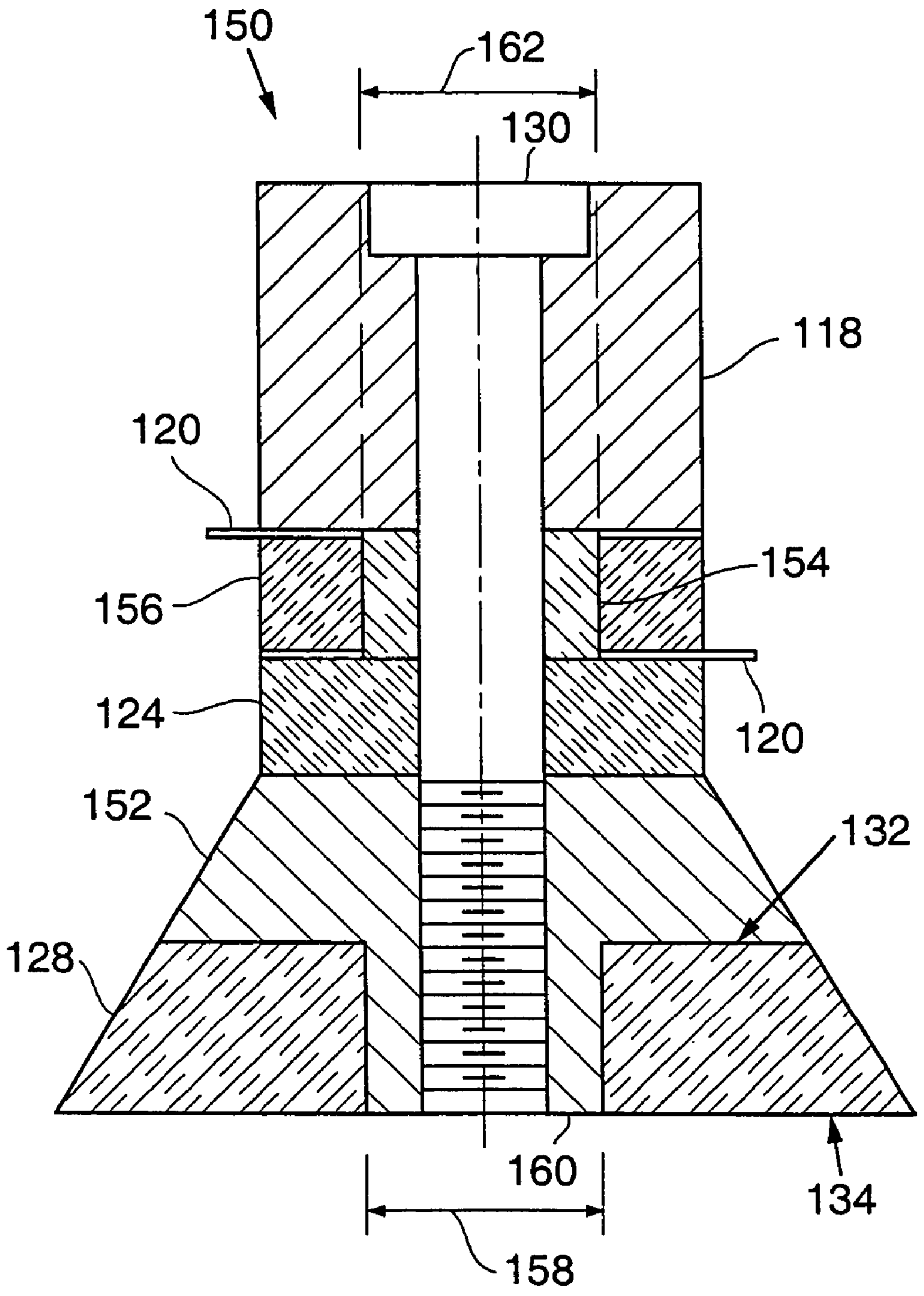
FIG. 3 is a side sectional view of an alternative embodiment of a sleeved ultrasonic transducer according to the present invention.

An alternative construction of the transducer 110 is shown in FIG. 3. Transducer 150 has a threaded sleeve 152 that extends downward to the bottom of the outer housing 128, which provides more thread area for the bolt 130 to engage. Also, transducer 150 has an insulated sleeve 154 inside the inner diameter of the PZT 156. Preferably, the outer diameter 158 of the lower protrusion 160 of the threaded sleeve 152 is substantially the same as the inner diameter 162 of the PZT 156. Such a construction may be more efficient in transferring the vibrational energy of the PZT through the outer housing 128 to the tank. Alternatively, the ceramic resonator 124 may have the same inner diameter as the PZT 156 with the insulated sleeve 154 extending downward to the top of the threaded sleeve 152.

One advantage of the construction of transducer 110 or 150 is that the outer housing 128 of the head mass can be made out of a metal or non-metallic material, such as silicon carbide, that has properties similar or identical to those of the tank material, which may be quartz or silicon carbide or other Advanced Ceramic. Silicon carbide is a polycrystalline material. There are many grains in a silicon carbide ceramic, with grain size being a few micrometers (direct sintered). There are different forms of quartz, including fused quartz and single crystal quartz. Fused quartz is an amorphous (non-crystalline, or glass) material. Generally speaking, single crystal quartz is one big grain. It can be as big as several inches (with only one grain). Fused quartz is amorphous, so it does not contain any grains.

The coefficients of thermal expansion of glass and ceramic are isotropic, meaning that it is not direction dependent. The coefficient of thermal expansion of a single crystal quartz is anisotropic (direction dependent), meaning it varies with the crystal orientation. Generally speaking, the coefficient of thermal expansion of quartz single crystal is about 15-20 times bigger than fused quartz glass. The preferred type of quartz for cleaning tanks is fused quartz. The coefficients of thermal expansion (in units of μm/m-° C.) are 0.4 for fused quartz, 4.5 for silicon carbide, 17 for stainless steel, 9 for titanium, and 23-24 for aluminum.

By using silicon carbide instead of aluminum for the portion of the head mass that is bonded to a cleaning tank, the thermal mismatch is reduced significantly. The mismatch in thermal expansion between two bonded materials induces stresses within the material/boundary when there is a temperature change. The difference in thermal expansion coefficients between aluminum and fused quartz is about 60 times, compared to 10 times between silicon carbide and fused quartz.

The transducer 110 or 150 is bonded to a surface (exterior or interior) of the tank with an epoxy polymer adhesive Supreme 10AOHT. This epoxy contains a ceramic filler of aluminum oxide (alumina). It is a heat curing epoxy with high shear strength and high peel strength. It also is thermally conductive and resistant to severe thermal cycling. The same adhesive is used to bond the silicon carbide outer housing 128 to the aluminum threaded sleeve 126 or 152.

Ceramics per se are inorganic non-metallic products. The outer housing may be composed of a non-metallic material including ceramics such as silicon carbide, aluminum oxide, or other Advanced Ceramics. As used herein, the term "Advanced Ceramics" is intended to mean ceramic materials having a minute grain size of a few microns or a fraction of a micron and which also have very high density with near zero porosity as measured in microns. The grain structure is highly uniform allowing ultrasonic signals to move in every direction simultaneously. Silicon Carbide is a preferred form of advanced ceramic and may be made from a chemical reaction with graphite. Using a ceramic material for the outer housing improves acoustic performance because ceramic is a better conductor of ultrasonic vibrational energy than aluminum and other metals, and may be preferred for that reason.

The use of silicon carbide in the head mass provides an ultrasonic transducer that can readily be bonded to a quartz or ceramic tank, which facilitates efficient transfer of ultrasonic vibrations from the transducer to the parts or items in the tank.

From the above description, it will be apparent that the invention disclosed herein provides a novel and advantageous cleaning tank with a sleeved ultrasonic transducer. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. An ultrasonic cleaning system comprising:

a tank composed of quartz or silicon carbide one or more ultrasonic transducers mounted to the tank, wherein each transducer includes a compressed stack that includes from the tank outward a head mass, a piezoelectric crystal, and a tail mass, wherein the head mass includes a threaded sleeve and an outer housing, and wherein the outer housing is composed of silicon carbide and is adhesively bonded to the tank and to the threaded sleeve.

2. An ultrasonic cleaning system as recited in claim 1, wherein the ultrasonic transducers are bonded to the tank using an epoxy with a ceramic filler.

3. An ultrasonic cleaning system as recited in claim 2, wherein the ceramic filler is aluminum oxide.

4. An ultrasonic cleaning system as recited in claim 1, wherein the ultrasonic transducers are bonded to the tank using a polymer adhesive Supreme 10AOHT.

5. An ultrasonic cleaning system as recited in claim 1, wherein the threaded sleeve has internal threads, and wherein the transducer further includes an axial bolt that screws into the internal threads of the threaded sleeve and compresses the piezoelectric crystal between the tail mass and the head mass.

6. An ultrasonic cleaning system as recited in claim 1, wherein the outer housing is bonded to the threaded sleeve using an epoxy with a ceramic filler.

7. An ultrasonic cleaning system as recited in claim 6, wherein the ceramic filler is aluminum oxide.

8. An ultrasonic cleaning system as recited in claim 1, wherein the outer housing is bonded to the threaded sleeve using a polymer adhesive Supreme 10AOHT.

9. An ultrasonic cleaning system as recited in claim 1, wherein the outer housing is annular in shape with an axial hole and wherein the threaded sleeve includes an axial protrusion that mates with the axial hole of the outer housing.

10. An ultrasonic cleaning system as recited in claim 1, wherein the ultrasonic transducer further comprises a resonator composed of a ceramic material and positioned between the piezoelectric crystal and the tail mass.

11. An ultrasonic cleaning system:

a transducer for generating ultrasound energy, said transducer including a head mass having an outer housing composed of a ceramic material and a threaded sleeve adhesively bonded to the head mass; and a tank for holding a cleaning liquid, wherein said tank is composed of a ceramic or quartz material, and wherein a ceramic portion of the head mass of the transducer is bonded to the tank so that vibrations produced by the transducer are transmitted through the head mass to the tank.

12. An ultrasonic cleaning system as recited in claim 11, wherein the tank is composed of silicon carbide material.

13. An ultrasonic cleaning system as recited in claim 11, wherein the tank is composed of quartz material.

14. An ultrasonic cleaning system as recited in claim 11, wherein the outer housing is composed of silicon carbide material.

15. An ultrasonic cleaning system as recited in claim 11, wherein said tank is formed from silicon carbide or other Advanced Ceramics with similar grain structure and porosity.

16. A method of cleaning items, comprising the steps of:

providing a tank for holding the items submerged in a liquid, wherein said tank is formed from an Advanced Ceramic or quartz; and transmitting ultrasonic energy from a transducer into the tank, wherein the transducer includes a head mass having an outer housing composed of a ceramic material and a threaded sleeve, wherein the outer housing is bonded to the tank and to the threaded sleeve.

17. An ultrasonic cleaning system comprising:

a tank composed of quartz or silicon carbide one or more ultrasonic transducers mounted to the tank, wherein each transducer includes one or more disk-shaped piezoelectric crystals, wherein each piezoelectric crystal has an axial hole;

a tail mass positioned on one side of the piezoelectric crystals, wherein the tail mass includes an axial hole;

a head mass positioned on a side of the piezoelectric crystals opposite the tail mass, wherein the head mass has an internally-threaded axial hole; and a threaded bolt positioned within the axial hole of each piezoelectric crystal and the axial holes of the tail mass and head mass and threaded into the internally-threaded axial hole of the head mass, wherein the bolt compresses the piezoelectric crystals between the tail mass and head mass;

wherein the head mass includes a threaded sleeve proximal to the piezoelectric transducers and an outer housing distal to the piezoelectric transducers, wherein the threaded sleeve includes the internally-threaded axial hole that mates with threads on the bolt, wherein the threaded sleeve and outer housing are composed of different materials, and wherein the outer housing has an axial hole and the threaded sleeve has a sleeve portion that fits inside the axial hole of the outer housing.

18. An ultrasonic cleaning system as recited in claim 17, wherein the threaded sleeve and the outer housing have mating contact surfaces on a plane perpendicular to an axis of the transducer.

19. An ultrasonic cleaning system as recited in claim 17, wherein the threaded sleeve and outer housing are bonded together using an epoxy with a ceramic filler.

20. An ultrasonic cleaning system as recited in claim 19, wherein the ceramic filler is aluminum oxide.

21. An ultrasonic cleaning system as recited in claim 19, wherein the epoxy is a polymer adhesive Supreme 10AOHT.

22. An ultrasonic cleaning system as recited in claim 17, wherein an outer diameter of the reduced diameter section of the sleeve portion of the threaded sleeve is substantially equal to an inner diameter of the one or more piezoelectric crystals.

23. An ultrasonic transducer as recited in claim 17, wherein the threaded sleeve is composed of titanium.

24. An ultrasonic transducer as recited in claim 17, wherein the threaded sleeve is composed of aluminum.

25. An ultrasonic transducer as recited in claim 17, wherein the outer housing is composed of silicon carbide.

* * * * *